(12) United States Patent
Park et al.

(10) Patent No.: US 9,294,081 B2
(45) Date of Patent: Mar. 22, 2016

(54) SYSTEM AND METHOD FOR BREAKDOWN PROTECTION FOR SWITCHING OUTPUT DRIVER

(71) Applicants: Chang Joon Park, Austin, TX (US); Charles E. Seaberg, Austin, TX (US)

(72) Inventors: Chang Joon Park, Austin, TX (US); Charles E. Seaberg, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 60 days.

(21) Appl. No.: 14/229,270

(22) Filed: Mar. 28, 2014

(65) Prior Publication Data

US 2015/0280701 A1  Oct. 1, 2015

(51) Int. Cl.
*H03K 3/00* (2006.01)
*H03K 17/08* (2006.01)
*H03K 17/687* (2006.01)

(52) U.S. Cl.
CPC ............ *H03K 17/08* (2013.01); *H03K 17/6872* (2013.01)

(58) Field of Classification Search
USPC ......... 327/108, 112, 379, 387, 389, 391, 427, 327/434; 326/80–83
See application file for complete search history.

(56) References Cited

U.S. PATENT DOCUMENTS

| | | | | |
|---|---|---|---|---|
| 6,316,977 B1* | 11/2001 | Sargeant | ............... | H03L 7/0896 327/157 |
| 6,844,769 B2* | 1/2005 | Yamamoto et al. | ........... | 327/333 |
| 7,254,000 B1 | 8/2007 | Smith et al. | | |
| 7,362,136 B2* | 4/2008 | Chen | ............................... | 326/81 |
| 8,633,737 B2* | 1/2014 | Wang et al. | .................. | 327/108 |
| 2006/0001480 A1 | 1/2006 | Barkley et al. | | |

OTHER PUBLICATIONS

Da Rocha, J., et al., "Level Shifters and DCVSL for a Low-Voltage CMOS 4.2-V Buck Converter", IEEE Transactions on Industrial Electronics, vol. 55, Issue 9, Sep. 2008, pp. 3315-3323.

* cited by examiner

Primary Examiner — An Luu

(57) ABSTRACT

An integrated circuit device includes a driver circuit (100) having a pull-up network with a first pull-up transistor (108) coupled to a second pull-up transistor (110) at a first node (VP), and a pull-down network coupled to the pull-up network including a first pull-down transistor (112) coupled to a second pull-down transistor (114) at a second node (VN). A first bias switch (116) is coupled to the first node. A second bias switch (118) is coupled to the second node. A control circuit (104) is coupled to operate the first and second bias switches. The first bias switch is operated to reduce a voltage at the first node during a pull-down cycle of the driver circuit and the second bias switch is operated to reduce a voltage at the second node during a pull-up cycle of the driver circuit.

20 Claims, 8 Drawing Sheets

SYSTEM AND METHOD FOR BREAKDOWN PROTECTION FOR SWITCHING OUTPUT DRIVER

BACKGROUND

1. Field

This disclosure relates generally to integrated circuit output drivers, and more specifically, to systems and method for breakdown protection for switching output drivers.

2. Related Art

For integrated circuit output drivers, the input voltage range may be higher than the voltage tolerance of the driver's constituent components. As integrated circuits decrease in size, the size of the constituent components accordingly decreases. With this size decrease, a corresponding decrease in the voltage tolerance of those components may also occur.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As the size of integrated circuits decreases, so does the size of the integrated circuit's constituent components. For example, as CMOS processes associated with the manufacture of integrated circuits scale down, the size of constituent MOSFETs also decrease. With this decrease in size may also come a decrease in the voltage tolerance of the constituent components. For example, in a DC-DC converter, the input voltage range of an output driver may range from 4.2V to 3.6V due to the range of the battery output voltage. In that same example, however, the components constituting the switches (e.g., the transistors) may not have sufficient stress tolerance to that maximum voltage. Those components may therefore be damaged by the higher voltage levels, particularly as those same components decrease in size.

One approach to dealing with the voltage stress tolerance issue is to reduce the voltage level applied to any given components. For example, the voltage may be split among one or more components such that only a portion of the higher voltage is applied to a given component. However, difficulties remain both in ensuring that the voltage is split evenly and in ensuring that power transfer remains efficient.

Figure 1:
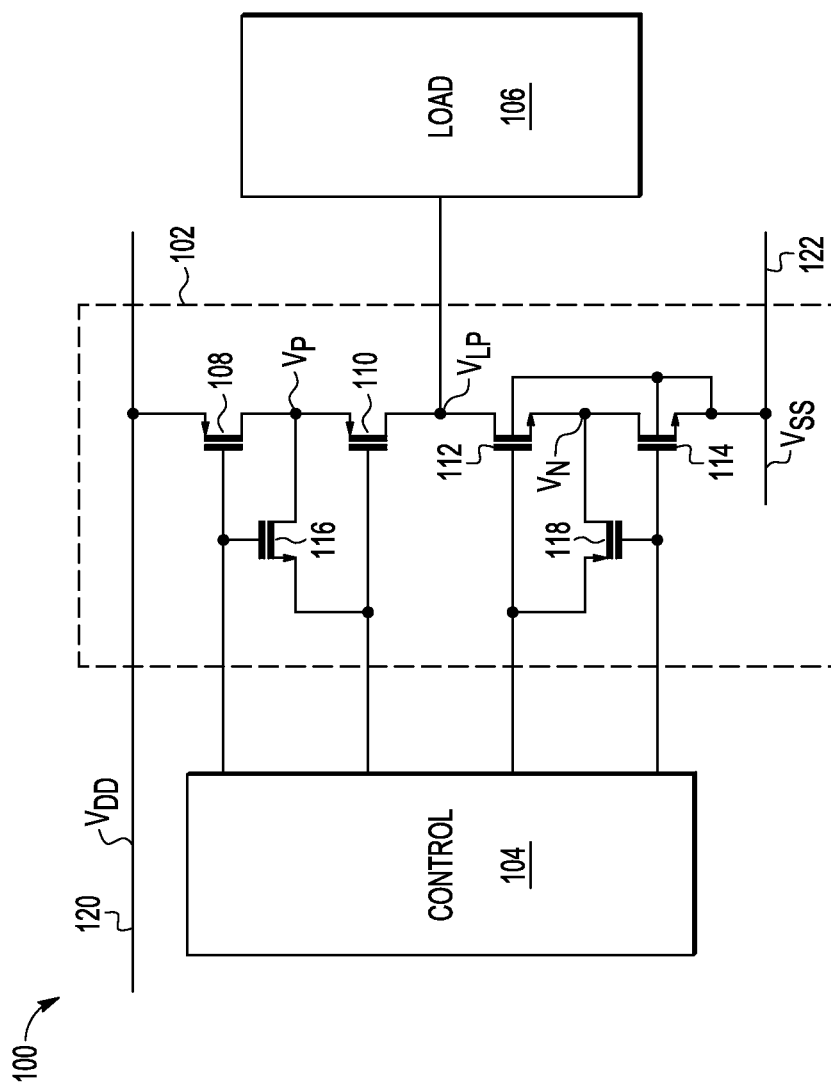
FIG. 1 illustrates an example configuration of electronic device including a driver circuit, control circuit, and load, driver circuit being configured to protect the components of driver circuit from breakdown, in accordance with certain embodiments of the present disclosure.

FIG. 1 illustrates an example configuration of electronic device 100 including a driver circuit 102, control circuit 104, and load 106, driver circuit 102 being configured to protect the components of driver circuit 102 from breakdown, in accordance with certain embodiments of the present disclosure.

In some embodiments, control circuit 104 may respond to a control signal in order to drive load 106 via driver circuit 102. Load 106 may be any appropriate electrical load, including an inductive load, capacitive load, resistive load, an integrated circuit memory module, an electronic device, and/or any combination thereof. Load 106 may also vary in complexity. For example, load 106 may be a diode, a flash memory module, or any other appropriate electronic component. Depending on the characteristics of load 106, the design characteristics of control circuit 104 and driver circuit 102 may be different. For example, as described in more detail below with reference to FIG. 4, if load 106 includes an inductive load portion, it may be necessary or desirable to couple load 106 to control circuit 104 in order to monitor the electrical characteristics of the power supplied to load 106.

Control circuit 104 may be any appropriate circuitry configured to operate driver circuit 102, as described in more detail below with reference to FIGS. 2-8. For example, control circuit 104 may include one or more level shifters configured to provide outputs of different voltage levels, as described in more detail with reference to FIGS. 4 and 6-8.

In some embodiments, electronic device 100 may also include a first supply voltage 120 and a second supply voltage 122 for powering the components of driver circuit 102. Supply voltage 120 may be any appropriate voltage source. For example, supply voltage 120 may be a battery voltage line supplying a voltage to drive load 106. The voltage supplied by supply voltage 120 may depend on multiple design considerations such as the type of battery. For example, supply voltage 120 may supply a voltage ranging from 4.2V to 3.6V. Second supply voltage 122 may be any appropriate voltage source such that second supply voltage 122 supplies a voltage amount less than first supply voltage 120. For example, second supply voltage 122 may supply a zero (e.g., ground) or negative voltage value.

First and second supply voltages 120, 122 may power the components of driver circuit 102. In some embodiments, driver circuit 102 may include one or more pull-up networks and one or more pull-down networks. The pull-up and pull-down networks may be configured to reduce the amount of voltage applied to any given component of driver circuit 102. For example, the pull-up and pull-down networks may be configured to split the voltage supplied by voltage source 120 such that only a portion (e.g., half) of the supplied voltage is applied to a given component.

In the example configuration illustrated in FIG. 1, driver circuit 102 includes one pull-up network and one pull-down network. The pull-up network may include a first pull-up transistor 108 coupled to a second pull-up transistor 110 at a first node $V_P$. In some embodiments, pull-up transistors 108, 110 may be p-channel MOSFETs. In such a configuration, first pull-up transistor 108 may be configured such that its drain is coupled to the source of second pull-up transistor 110. The source of first pull-up transistor 108 may be coupled to first supply voltage 120. In some configurations, second pull-up transistor 110 may be referred to as a "cascode" transistor.

In some embodiments, the pull-up and pull-down networks of driver circuit 102 may be coupled to one another at a node. For example, the pull-up network may be coupled to the pull-down network at node $V_{LP}$. The voltage level at this node may be the voltage level required to drive at least a portion of load 106. For example, as described in more detail below with reference to FIGS. 2-8, load 106 may require the full voltage supplied by first voltage supply 120. Driver circuit 102 may operate to ensure that the desired voltage level is supplied to load 106 while preventing breakdown of the components of driver circuit 102. Although certain numbers and configurations of pull-up and pull-down networks are illustrated in FIG. 1, these are provided for ease of illustration. Others may be implemented within driver circuit 102 without departing from the scope of the present disclosure.

Driver circuit 102 also includes first bias switch 116 and second bias switch 118. First bias switch 116 may be any appropriate circuitry configured to reduce a voltage at a first node during a pull-down cycle of driver circuit 102. First bias switch 116 may be coupled to first pull-up transistor 108, second pull-up transistor 110, and control circuit 104. For example, first bias switch 116 may include an n-channel MOSFET. The gate of this transistor may be coupled to the gate of first pull-up transistor 108 as well as control circuit 104, as described in more detail below with reference to FIGS. 2-5. The drain of this transistor may be coupled to the drain of first pull-up transistor 108, as well as the source of second pull-up transistor 110, at the node labeled $V_P$. Further, the source of this transistor may be coupled to the gate of second pull-up transistor 110 as well as control circuit 104, as described in more detail below with reference to FIGS. 2-5. First bias switch 116 may operate to ensure a switched bias voltage at first and second pull-up transistors 108, 110 as well as to reduce a voltage at node $V_P$ during a pull-down cycle of driver circuit 102.

Driver circuit 102 also includes second bias switch 118. Second bias switch 118 may be any appropriate circuitry configured to reduce a voltage at a second node during a pull-up cycle of driver circuit 102. Second bias switch 118 may be coupled to first pull-down transistor 112, second pull-down transistor, and control circuit 104. For example, second bias switch 118 may include a p-channel MOSFET. The gate of this transistor may be coupled to the gate of second pull-down transistor 114 as well as control circuit 104, as described in more detail below with reference to FIGS. 2-5. The drain of this transistor may be coupled to the source of first pull-down transistor 112, as well as the drain of second pull-down transistor 114, at the node labeled $V_N$. Further, the source of this transistor may be coupled to the gate of first pull-down transistor 112 as well as control circuit 104, as described in more detail below with reference to FIGS. 2-5. Second bias switch 118 may operate to ensure a switched bias voltage at first and second pull-down transistors 112, 114, as well as to reduce a voltage at node $V_N$ during a pull-up cycle of driver circuit 102. Although a certain configuration of driver circuit 102 is illustrated in FIG. 1, one of ordinary skill in the art would recognize that other configurations of driver circuit 102 may be possible without departing from the scope of the present disclosure.

In some embodiments, bias switches 116, 118 may be coupled together, as described in more detail below with reference to FIGS. 3-4. In such configurations, bias switches 116, 118 may have substantially the same bias voltage. For example, the sources of transistors included in bias switches 116, 118 may be coupled together and then coupled to a bias voltage source. In the same or alternative embodiments, bias switches 116, 118 may have different bias voltages, as described in more detail below with reference to FIGS. 2 and 5.

Figure 2:
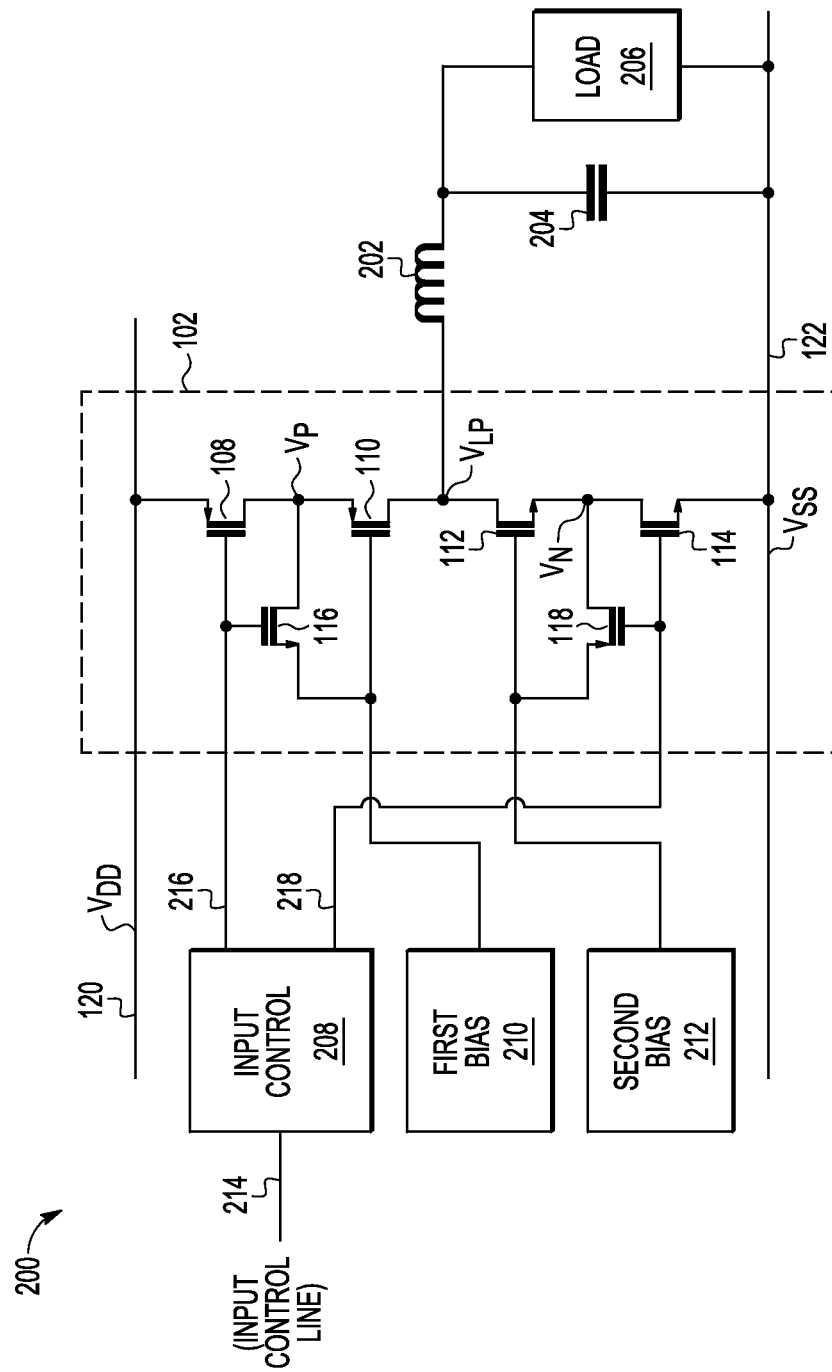
FIG. 2 illustrates an example configuration of electronic device including a driver circuit, input control, first bias, second bias, and load components, in accordance with certain embodiments of the present disclosure.

FIG. 2 illustrates an example configuration of electronic device 200 including a driver circuit 102, input control 208, first bias 210, second bias 212, and load components 202, 204, 206, in accordance with certain embodiments of the present disclosure.

In some embodiments, control circuit 104 illustrated in FIG. 1 may be illustrated as components generally corresponding to control components (e.g., input control 208) and bias components (e.g., first bias 210 and second bias 212). In the example configuration of FIG. 2, input control 208 operates to control the operation of bias switches 116, 118. For example, input control 208 may be driven by an input control signal on input control line 214. In some configurations, the input control signal may be a DC signal, AC signal, or any other appropriate signal configured to operate driver circuit 102. Input control 208 may also include one or more control lines such as pull-up network control 216 and pull-down network control 218. Control lines 216, 218 function as the output of input control 208.

Electronic device 200 may also include one or more bias voltage sources. For example, electronic device 200 may include a first bias 210 coupled to first bias switch 116 and a second bias 212 coupled to second bias switch 118. In some configurations, first bias 210 and second bias 212 may be substantially similar. For example, it may be desirable to ensure that both the pull-up network(s) and the pull-down network(s) split the supply voltage evenly. In the same or alternative configurations, first bias 210 may be different from second bias 212. For example, it may be desirable to have unbalanced bias voltages between the pull-up and pull-down networks in order to accommodate differences in structure, material, configuration, and/or other design considerations.

In some embodiments, electronic device 200 may also include a plurality of load components. For example, electronic device 200 may include a load defined and/or modeled by inductor 202, capacitor 204, and load 206. Load 206 may be a resistive load or any other appropriate components comprising, associated with, and/or used to model an electronic load. As an illustrative example only, electronic device 200 may be a portion of a DC-DC converter. In such an example, load 106 may include inductor 202, capacitor 204, and load 206 wherein load 206 is a resistive load.

Figure 3:
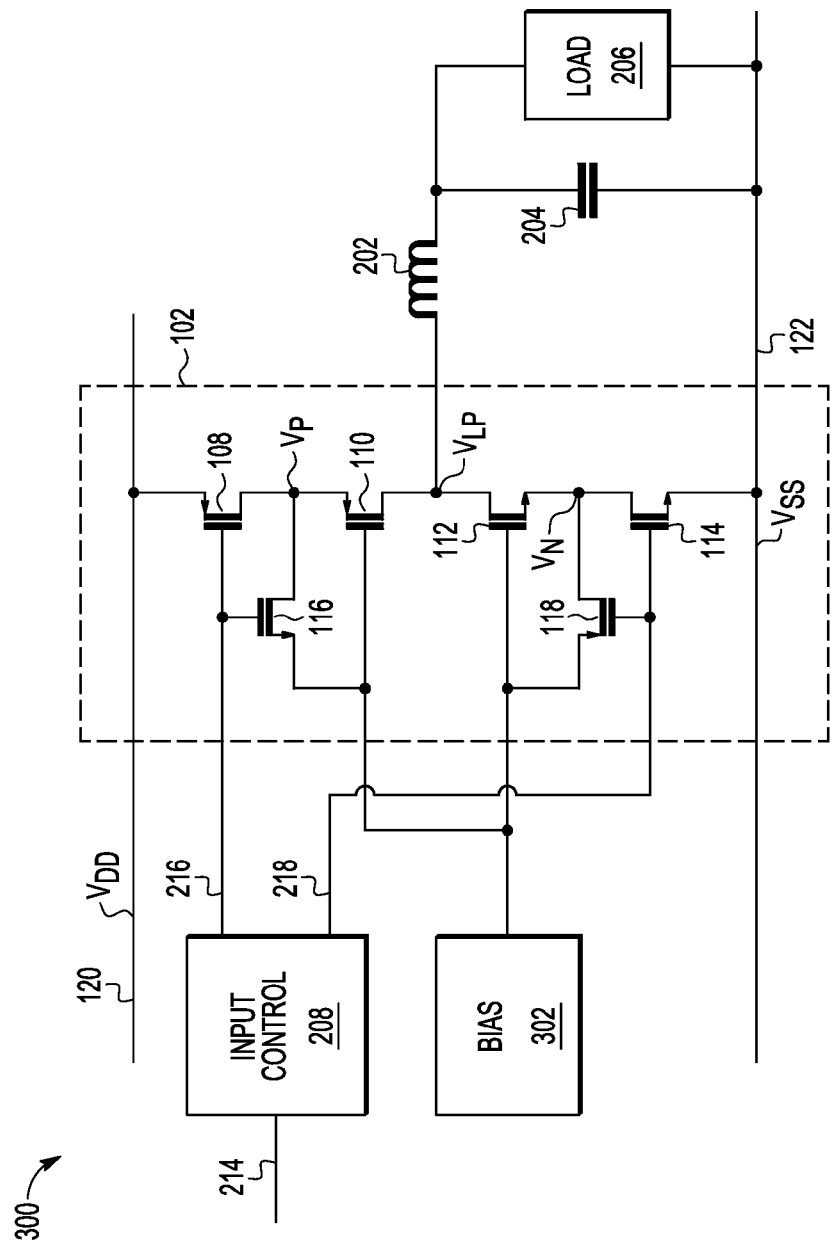
FIG. 3 illustrates an example configuration of electronic device including a driver circuit, input control, and bias, in accordance with certain embodiments of the present disclosure.

FIG. 3 illustrates an example configuration of electronic device 300 including a driver circuit 102, input control 208, and bias 302, in accordance with certain embodiments of the present disclosure. In some embodiments, first bias switch 116 and second bias switch 118 may be configured to operate at substantially identical bias voltages. In such a configuration, it may be more efficient to couple both first bias switch 116 and second bias switch 118 to a single bias voltage source 302, as illustrated in FIG. 3.

Figure 4:
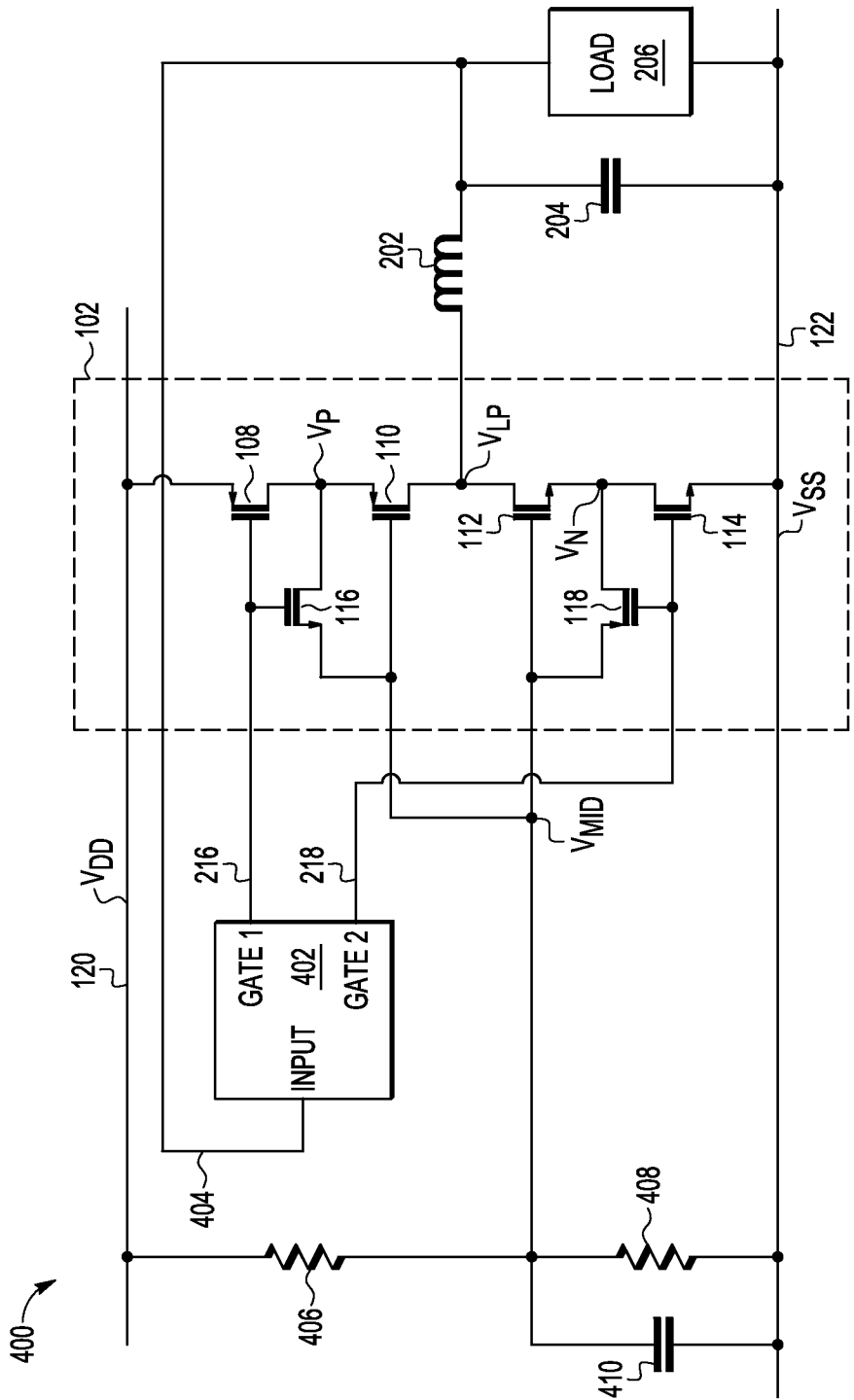
FIG. 4 illustrates an example configuration of electronic device including a driver circuit, gate driver, and bias components, in accordance with certain embodiments of the present disclosure.

FIG. 4 illustrates an example configuration of electronic device 400 including a driver circuit 102, gate driver 402, and bias components 406, 408, 410, in accordance with certain embodiments of the present disclosure.

In some embodiments, input control 208 may be configured as gate driver 402. Gate driver 402 may be any appropriate circuitry configured to drive bias switches 116, 118 according to an input control signal received on input control line 404. For example, in a DC-DC converter, it may be necessary to monitor the power supplied to load 106 and thus adjust driver circuit 102 due to the properties of inductor 202. In such a configuration, gate driver 402 may be coupled to inductor 202 via input control line 404. As described in more detail below with reference to FIGS. 7-8, circuitry within gate driver 402 may be used to supply bias switches 116, 118 with appropriate voltage levels via control lines 216, 218.

In some embodiments, electronic device 400 may also include a plurality of bias components used to provide a bias voltage to driver circuits 116, 118. As described in more detail above with reference to FIGS. 1-3, it may be desirable to provide one or more bias voltage levels to driver circuits 116, 118. In some configurations, this may include coupling first bias switch 116 to second bias switch 118 at a node. For example, the sources of transistors included in bias switches 116, 118 may be coupled together at node $V_{MID}$.

Electronic device 400 may then implement a plurality of components to provide one or more bias levels to bias switches 116, 118. For example, electronic device 400 may include resistors 406, 408, and capacitor 410. In some configurations, resistors 406, 408 may be arranged in a voltage divider configuration. For example, resistors 406, 408 may have substantially identical values (e.g., in order to split the first supply voltage evenly between the pull-up and pull-down networks). In the same or alternative configurations, resistors 406, 408 may have different values, resulting in different bias values for the pull-up and pull-down networks. In still further configurations, it may be necessary or desirable to separate the differing bias levels from one another, as described in more detail below with reference to FIG. 5.

Figure 5:
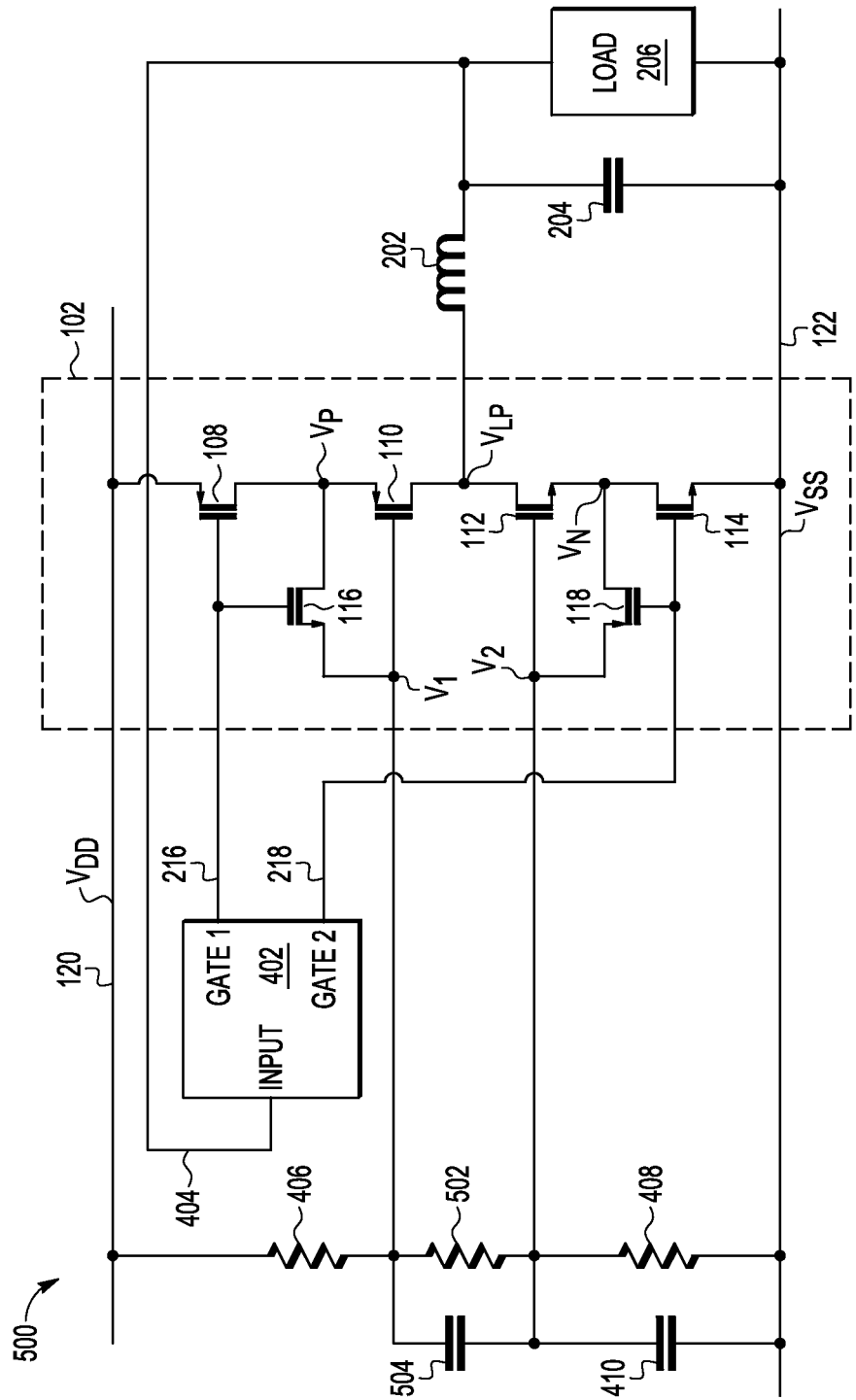
FIG. 5 illustrates an example configuration of electronic device including a driver circuit and bias components, in accordance with certain embodiments of the present disclosure.

FIG. 5 illustrates an example configuration of electronic device 500 including a driver circuit 102 and bias components 502, 504, in accordance with certain embodiments of the present disclosure.

In some embodiments, electronic device 500 may implement a plurality of components to provide one or more bias levels to bias switches 116, 118. For example, electronic device 400 may include resistors 406, 408, 502, and capacitors 410, 504. In some configurations, it may be necessary or desirable to separate the differing bias levels from one another. In such configurations, resistor 502 and capacitor 504 may operate to provide a bias level to first bias switch 116, while resistor 408 and capacitor 410 may operate to provide a bias level to second bias switch 118.

Figure 6:
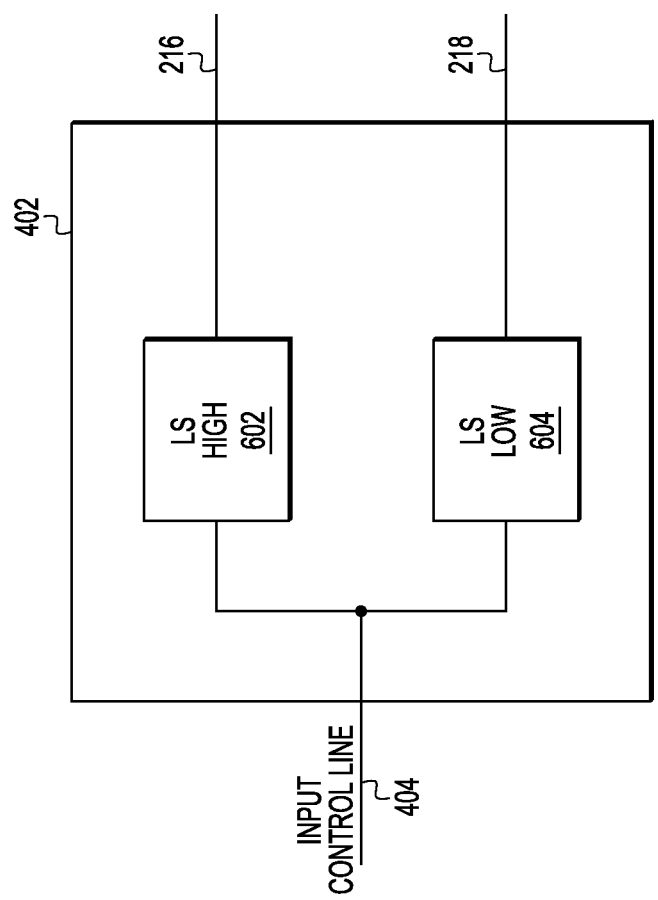
FIG. 6 illustrates an example configuration of a gate driver including a plurality of level shifters, in accordance with certain embodiments of the present disclosure.

FIG. 6 illustrates an example configuration of a gate driver 402 including a plurality of level shifters 602, 604, in accordance with certain embodiments of the present disclosure. In some embodiments, input control line 404 may provide an input control signal to a plurality of level shifters 602, 604. Level shifter 602 may, for example, be configured to shift the input control signal to an appropriate high interval while level shifter 604 may, for example, be configured to shift the input control signal to an appropriate low interval.

For example, in the example illustrated above with reference to FIG. 4, the pull-up network may include one or more p-channel MOSFETs and the pull-down network may include one or more n-channel MOSFETs. In such a configuration, the pull-up and pull-down configurations may operate using different voltage intervals. Using the example of a DC-DC converter using a Lithium-ion battery, the supply voltage may be 3.6 V. In order to prevent breakdown of the components of driver circuit 102, control circuit 104 may operate to provide less than the maximum supply voltage to bias switches 116, 118. For example, control circuit 104 may operate to provide half of the maximum supply voltage to each of bias switches 116, 118. In order to implement this operation, level shifter 602 may operate to shift the control signal received at input control line 404 to a signal corresponding to the desired voltage level (e.g., half of the maximum supply voltage), but at the high side of the voltage range (e.g., from 1.8V to 3.6V) while retaining appropriate timing and other signaling information from the control signal. Likewise, level shifter 604 may operate to shift the control signal received at input control line 404 to a signal corresponding to the desired voltage level (e.g., half of the maximum supply voltage), but at the low side of the voltage range (e.g., from 0V to 1.8V) while retaining appropriate timing and other signaling information from the control signal.

Figure 7:
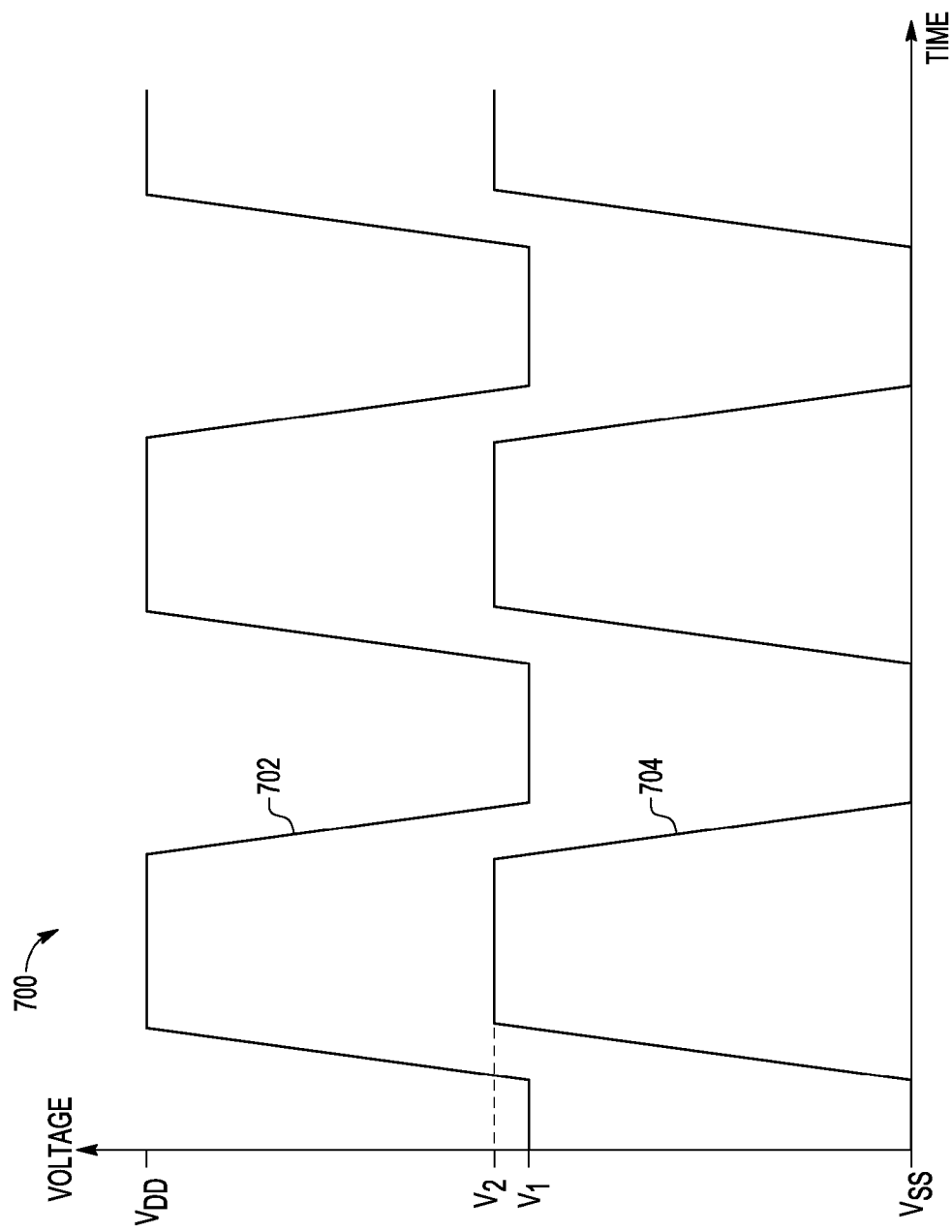
FIG. 7 illustrates an example diagram depicting gate control signals for bias switches, in accordance with certain embodiments of the present disclosure.

FIG. 7 illustrates an example diagram 700 depicting gate control signals 702, 704 for bias switches 116, 118, in accordance with certain embodiments of the present disclosure. In example diagram 700, gate control signal 702 switches between two voltage levels, identified as $V_{DD}$ and $V_1$. In some embodiments, $V_1$ may be associated with a first bias voltage. For example, as depicted in FIG. 4, these voltage levels are associated with the voltage levels of the first supply voltage ($V_{DD}$) and the node at which the bias switches 116, 118 are coupled ($V_{MID}$). As an additional example, as depicted in FIG. 5, these voltage levels are associated with the voltage levels of the first supply voltage ($V_{DD}$) and the node at which the first bias switch 116 is coupled to a bias circuit 502, 504 ($V_1$). Depending on certain design considerations associated with the desired bias voltage levels, $V_1$ and $V_{MID}$ may be the same (e.g., as illustrated in FIG. 4), substantially the same, or different.

As illustrated in example diagram 700, control signal 702 is the output control signal placed on control line 216, which is then used to control first bias switch 116. In such a configuration, control signal 702 may control first bias switch 116 to reduce a voltage at the pull-up network node ($V_P$) during a pull-down cycle of driver circuit 102. In such a way, the components of the pull-up network(s) are only subjected to a portion of the first supply voltage, as described in more detail above with reference to FIGS. 1-6.

Further, in example diagram 700, gate control signal 704 switches between two voltage levels, identified as $V_2$ and $V_{SS}$. In some embodiments, $V_2$ may be associated with a second bias voltage. For example, as depicted in FIG. 4, these voltage levels are associated with the voltage levels of the second supply voltage ($V_{SS}$) and the node at which the bias switches 116, 118 are coupled ($V_{MID}$). As an additional example, as depicted in FIG. 5, these voltage levels are associated with the voltage levels of the second supply voltage ($V_{SS}$) and the node at which the second bias switch 1 is coupled to a bias circuit 408, 410 ($V_2$). Depending on certain design considerations associated with the desired bias voltage levels, $V_2$ and $V_{MID}$ may be the same (e.g., as illustrated in FIG. 4), substantially the same, or different.

As illustrated in example diagram 700, control signal 704 is the output control signal placed on control line 218, which is then used to control second bias switch 118. In such a configuration, control signal 704 may control second bias switch 118 to reduce a voltage at the pull-down network node ($V_N$) during a pull-up cycle of driver circuit 102. In such a way, the components of the pull-down network(s) are only subjected to a portion of the first supply voltage, as described in more detail above with reference to FIGS. 1-6.

Figure 8:
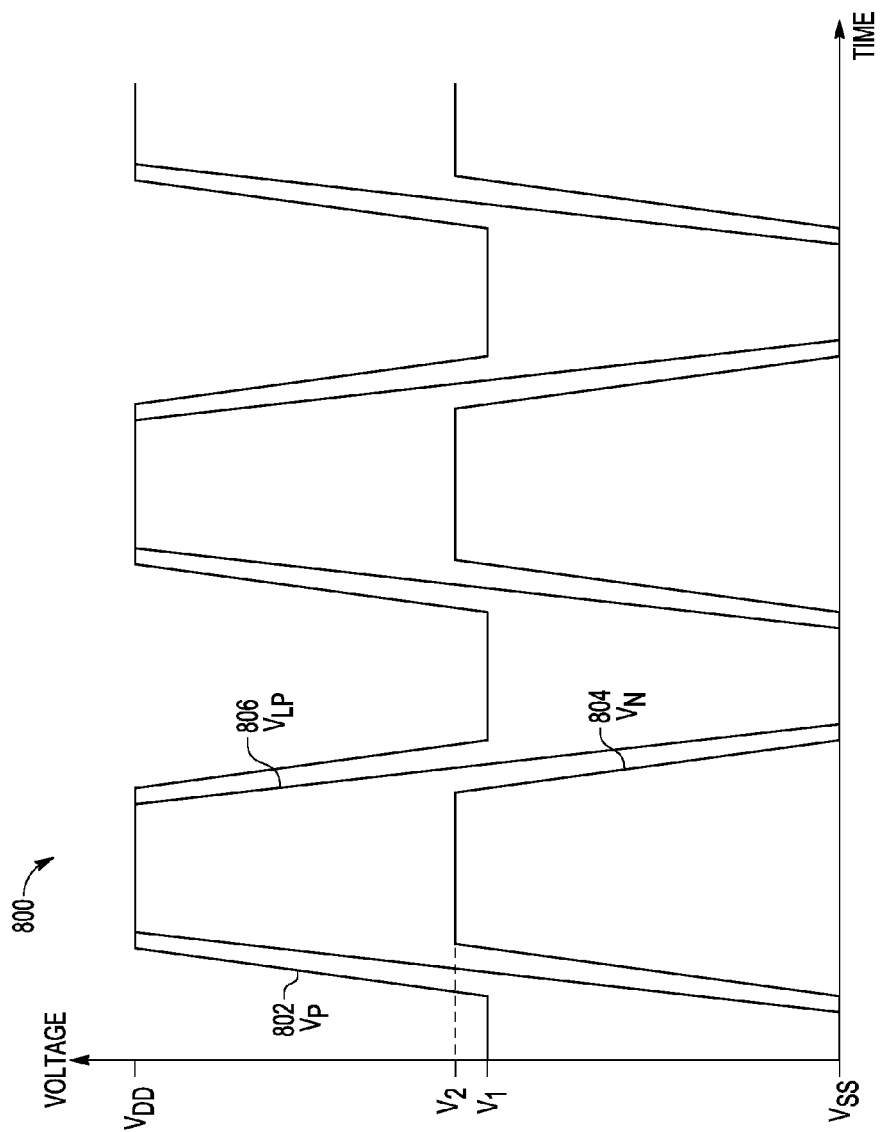
FIG. 8 illustrates an example diagram depicting waveforms at a plurality of nodes internal to an electronic device, in accordance with certain embodiments of the present disclosure.

FIG. 8 illustrates an example diagram 800 depicting waveforms 802, 804, 806 at a plurality of nodes internal to an electronic device, in accordance with certain embodiments of the present disclosure. As illustrated in the example diagram 800, waveform 802 is associated with the voltage level at the pull-up network ($V_P$), and switches between two voltage levels, identified as $V_{DD}$ and $V_1$. In some embodiments, $V_1$ may be associated with a first bias voltage. For example, as depicted in FIG. 4, these voltage levels are associated with the voltage levels of the first supply voltage ($V_{DD}$) and the node at which the bias switches 116, 118 are coupled ($V_{MID}$). As an additional example, as depicted in FIG. 5, these voltage levels are associated with the voltage levels of the first supply voltage ($V_{DD}$) and the node at which the first bias switch 116 is coupled to a bias circuit 502, 504 ($V_1$). Depending on certain design considerations associated with the desired bias voltage levels, $V_1$ and $V_{MID}$ may be the same (e.g., as illustrated in FIG. 4), substantially the same, or different.

As illustrated in example diagram 800, waveform 804 is associated with the voltage level at the pull-down network ($V_N$) and switches between two voltage levels, identified as $V_{SS}$ and $V_2$. In some embodiments, $V_2$ may be associated with a second bias voltage. For example, as depicted in FIG. 4, these voltage levels are associated with the voltage levels of the second supply voltage ($V_{SS}$) and the node at which the bias switches 116, 118 are coupled ($V_{MID}$). As an additional example, as depicted in FIG. 5, these voltage levels are associated with the voltage levels of the second supply voltage ($V_{SS}$) and the node at which the second bias switch 118 is coupled to a bias circuit 408, 410 ($V_2$). Depending on certain design considerations associated with the desired bias voltage levels, $V_2$ and $V_{MID}$ may be the same (e.g., as illustrated in FIG. 4), substantially the same, or different.

As illustrated in example diagram 800, the individual components of the pull-up and pull-down networks are subjected to only a portion of the maximum supply voltage. Further, waveform 806 is associated with the voltage level associated with the power supplied to load 106. Waveform 806 switches between two voltage levels, identified as $V_{DD}$ and $V_{SS}$. As depicted in FIG. 4, these voltage levels are associated with the first supply voltage ($V_{DD}$) and the second supply voltage ($V_{SS}$). As illustrated in example diagram 800, the voltage level supplied to load 106 maintains the maximum range associated with the difference between first supply voltage 120 and second supply voltage 122.

By now it should be appreciated that there has been provided systems and methods for breakdown protection for switching an output driver. In particular, it should be appreciated that there has been provided systems and methods for protecting components of driver circuitry from exposure to the relatively higher voltages required by circuits loads that may damage driver circuitry component.

In some embodiments, the electronic device may include a driver circuit (106) including a pull-up network coupled to a pull-down network. The pull-up network may include a first pull-up transistor (108) coupled to a second pull-up transistor (110) at a first node ($V_P$), while the pull-down network may include a first pull-down transistor (112) coupled to a second pull-down transistor (114) at a second node ($V_N$). The device may also include a first bias switch (116) coupled to the first node and a second bias switch (118) coupled to the second node. Further, the device may include a control circuit (104) coupled to operate the first and second bias switches. The first bias switch may be operated to reduce a voltage at the first node during a pull-down cycle of the driver circuit and the second bias switch may be operated to reduce a voltage at the second node during a pull-up cycle of the driver circuit.

In the same or alternative embodiments, the device may also include a third node ($V_{LP}$) at a coupling between the pull-up network and the pull-down network, as well as a load (106) coupled to the third node. In certain configurations, the load may include at least one of a group consisting of: a capacitive load, an inductive load, a resistive load, an integrated circuit memory module, and an electronic device.

In some embodiments, the first and second pull-up transistors may be P-channel transistors, while the first and second pull-down transistors may be N-channel transistors. Further, a source of the first P-channel transistor may be coupled to a supply voltage ($V_{DD}$), a drain of the first P-channel transistor may be coupled to a source of the second P-channel transistor, a drain of the second P-channel transistor may be coupled to a drain of the first N-channel transistor, a source of the first N-channel transistor may be coupled to a drain of the second N-channel transistor, and a source of the second N-channel transistor may be coupled to a second supply voltage ($V_{SS}$).

In some configurations of such embodiments, the device may also include a bias circuit. In addition, the first bias switch may be an N-channel transistor having a drain coupled to the first node ($V_P$), a source coupled to output from the bias circuit, and a gate coupled to a first gate control signal (216). Further, the second bias switch may be a P-channel transistor having a source coupled to the output from the bias circuit, a gate coupled to a second gate control signal (218), and a drain coupled to the second node ($V_N$).

Still further, in some embodiments, a gate of the first P-channel transistor may be coupled to the first gate control signal (216), a gate of the second P-channel transistor may be coupled to the output of the bias circuit, a gate of the first N-channel transistor may be coupled the output of the bias circuit, and a gate of the second N-channel transistor may be coupled to the second gate control signal (218).

In addition, the output from the bias circuit may include a first output and a second output where the gate of the second P-channel transistor and the source of the N-channel transistor of the first bias switch may be coupled to the first output of the bias circuit, and the gate of the first N-channel transistor and the source of the P-channel transistor of the second bias switch may be coupled to the second output of the bias circuit.

In some embodiments, the electronic device may further include a first supply voltage ($V_{DD}$) configured to provide a maximum voltage and a second supply voltage ($V_{SS}$) configured to provide a minimum voltage. The control circuit may then include an input, a first output coupled to the first bias switch, and a second output coupled to the second bias switch. The first output may be driven between the first supply voltage and a first intermediate voltage between the first and second supply voltages, and the second output may be driven between the second supply voltage and a second intermediate voltage between the first and second supply voltages. In some configurations, the input of the control circuit may be coupled to an output of the integrated circuit device at a load.

In some embodiments, the electronic device may be a DC-DC converter, an I/O pad driver, a flash memory device, a light emitting diode (LED) driver, a system on a chip including a processing core, and/or a memory module.

A method of driving a voltage in an integrated circuit device is also disclosed. In some embodiments, the method may include biasing a pull-up portion of a driver circuit (100) to a first bias voltage, the first bias voltage being coupled at a first node between a drain of a first P-channel transistor (108) and a source of a second P-channel transistor (110) in the pull-up portion of the driver circuit; and biasing a pull-down portion of the driver circuit to a second bias voltage, the second bias voltage being coupled at a second node between a source of a first N-channel transistor (112) and a drain of a second N-channel transistor (114) in the pull-down portion of the driver circuit. The first bias voltage may vary between a maximum supply voltage ($V_{DD}$) and an intermediate value of the maximum supply voltage, and the second bias voltage may vary between a minimum supply voltage ($V_{SS}$) and an intermediate value of the minimum supply voltage.

In some configurations, the first bias voltage may reduce a voltage at the first node during a pull-down cycle of the driver circuit and the second bias voltage may reduce a voltage at the second node during a pull-up cycle of the driver circuit.

An integrated circuit device is also disclosed. In some embodiments, the integrated circuit device may include a driver circuit and a plurality of supply voltages. The driver circuit (100) may include a pull-up section including a first P-channel transistor (108) and a cascode P-channel transistor (110); a pull-down section including a cascode N-channel transistor (112) and a first N-channel transistor (114); a first bias voltage ($V_P$) coupled between a drain of the first P-channel transistor and a source of the cascode P-channel transistor; and a second bias voltage ($V_N$) coupled between a source of the cascode N-channel transistor and a drain of the first N-channel transistor. The integrated circuit device may also include a maximum supply voltage ($V_{DD}$) coupled to a source of the first P-channel transistor and a minimum supply voltage ($V_{SS}$) coupled to a source of the first N-channel transistor. The first bias voltage may be controlled between the maximum supply voltage and an intermediate value of the maximum supply voltage that is greater than the minimum supply voltage, while the second bias voltage may be controlled between the minimum supply voltage and an intermediate value of the minimum supply voltage that is less than the maximum supply voltage. The integrated circuit device may also include an output node ($V_{LP}$) coupled between the pull-up section and the pull-down section, wherein the output node is coupled to provide a specified voltage to a load (206).

In the same or alternative embodiments, the integrated circuit device may further include a bias generator, a first bias switch, and a second bias switch. The first bias switch may include an N-channel transistor (116) having a drain connected to a first node at the first bias voltage ($V_P$), a source coupled to a first output of the bias generator, and a gate coupled to a first output of a gate control module. The second bias switch may include a P-channel transistor (118) having a drain connected to a second node at the second bias voltage ($V_N$), a source coupled to a second output of the bias generator, and a gate coupled to a second output of the gate control module.

In the same or alternative embodiments, the bias generator may include a voltage divider (406, 408) coupled between the maximum supply voltage and the minimum supply voltage. The voltage divider may include a series of resistive elements and a capacitor (410) coupled in parallel with one of the resistive elements (408). The first output may be tapped before the one of the resistive elements, and the second output may be tapped after the one of the resistive elements. 20. In some configurations, a gate of the cascode P-channel transistor may be coupled to the first output of the bias generator, and a gate of the cascode N-channel transistor may be coupled to the second output of the bias generator.

In the same or alternative embodiments, the device may further include a gate control module (402) including an input, a first output and a second output. The first output may be coupled to a gate of the N-channel transistor (116) of the first bias switch and a gate of the first P-channel transistor (108) of the pull-up section. The second output may be coupled to a gate of the P-channel transistor (118) of the second bias switch and a gate of the first N-channel transistor (114) of the pull-down section.

Further, the gate control module may include a first level shifter (602) configured to receive a signal at the input and to provide the first output. And a second level shifter (604) configured to receive the signal at the input and to provide the second output. In some configurations, the input to the gate control module may be coupled to the specified voltage to the load.

In still other embodiments, the device may be configured such that a drain of the first P-channel transistor may be coupled to a source of the cascode P-channel transistor of the pull-up section, and a source of the cascode N-channel transistor may be coupled to a drain of the first N-channel transistor of the pull-down section.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Also for example, in one embodiment, the illustrated elements of electronic device 100 are circuitry located on a single integrated circuit or within a same device. Alternatively, electronic device 100 may include any number of separate integrated circuits or separate devices interconnected with each other. For example, load 106 may be located on a same integrated circuit as control circuit 104 and driver circuit 102 or on a separate integrated circuit.

Although the invention is described herein with reference to specific embodiments, various modifications and changes can be made without departing from the scope of the present invention as set forth in the claims below. For example, more, fewer, or different components of electronic device 100 may be present. As an additional example, different components may be used to implement the circuitry described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:
1. An integrated circuit device comprising:
 a driver circuit including:
  a pull-up network including a first pull-up transistor coupled to a second pull-up transistor at a first node;

a pull-down network coupled to the pull-up network including a first pull-down transistor coupled to a second pull-down transistor at a second node;
a first bias switch coupled to the first node;
a second bias switch coupled to the second node; and
a control circuit coupled to operate the first and second bias switches, the first bias switch is operated to reduce a voltage at the first node during a pull-down cycle of the driver circuit and the second bias switch is operated to reduce a voltage at the second node during a pull-up cycle of the driver circuit.

2. The device of claim 1, further comprising:
a third node (VLP) at a coupling between the pull-up network and the pull-down network; and
a load (106) coupled to the third node.

3. The device of claim 2, wherein the load includes at least one of a group consisting of a capacitive load, an inductive load, a resistive load, an integrated circuit memory module, and an electronic device.

4. The device of claim 1, wherein:
the first and second pull-up transistors are P-channel transistors,
the first and second pull-down transistors are N-channel transistors,
a source of the first P-channel transistor is coupled to a supply voltage, a drain of the first P-channel transistor is coupled to a source of the second P-channel transistor, a drain of the second P-channel transistor is coupled to a drain of the first N-channel transistor, a source of the first N-channel transistor is coupled to a drain of the second N-channel transistor, and a source of the second N-channel transistor is coupled to a second supply voltage.

5. The device of claim 4, further comprising:
a bias circuit;
the first bias switch is an N-channel transistor having a drain coupled to the first node, a source coupled to output from the bias circuit, and a gate coupled to a first gate control signal;
the second bias switch is a P-channel transistor having a source coupled to the output from the bias circuit, a gate coupled to a second gate control signal, and a drain coupled to the second node.

6. The device of claim 5, further comprising:
a gate of the first P-channel transistor is coupled to the first gate control signal;
a gate of the second P-channel transistor is coupled to the output of the bias circuit;
a gate of the first N-channel transistor is coupled the output of the bias circuit; and
a gate of the second N-channel transistor is coupled to the second gate control signal.

7. The device of claim 6, wherein:
the output from the bias circuit includes a first output and a second output,
the gate of the second P-channel transistor and the source of the N-channel transistor of the first bias switch are coupled to the first output of the bias circuit,
the gate of the first N-channel transistor and the source of the P-channel transistor of the second bias switch are coupled to the second output of the bias circuit.

8. The device of claim 1, further comprising:
a first supply voltage configured to provide a maximum voltage;
a second supply voltage configured to provide a minimum voltage;

the control circuit includes an input, a first output coupled to the first bias switch, and a second output coupled to the second bias switch,
the first output is driven between the first supply voltage and a first intermediate voltage between the first and second supply voltages, and
the second output is driven between the second supply voltage and a second intermediate voltage between the first and second supply voltages.

9. The device of claim 8, wherein the input of the control circuit is coupled to an output of the integrated circuit device at a load.

10. The device of claim 5, wherein the bias circuit includes a voltage divider coupled between the supply voltage and the second supply voltage, the voltage divider including a series of resistive elements.

11. A method of driving a voltage in an integrated circuit device comprising:
biasing a pull-up portion of a driver circuit to a first bias voltage, the first bias voltage being coupled at a first node between a drain of a first P-channel transistor and a source of a second P-channel transistor in the pull-up portion of the driver circuit;
biasing a pull-down portion of the driver circuit to a second bias voltage, the second bias voltage being coupled at a second node between a source of a first N-channel transistor and a drain of a second N-channel transistor in the pull-down portion of the driver circuit; and
wherein the first bias voltage varies between a maximum supply voltage and an intermediate value of the maximum supply voltage, and the second bias voltage varies between a minimum supply voltage and an intermediate value of the minimum supply voltage.

12. The method of claim 11, wherein the first bias voltage reduces a voltage at the first node during a pull-down cycle of the driver circuit and the second bias voltage reduces a voltage at the second node during a pull-up cycle of the driver circuit.

13. An integrated circuit device, comprising:
a driver circuit including:
a pull-up section including a first P-channel transistor and a cascode P-channel transistor;
a pull-down section including a cascode N-channel transistor and a first N-channel transistor;
a first bias voltage coupled between a drain of the first P-channel transistor and a source of the cascode P-channel transistor; and
a second bias voltage coupled between a source of the cascode N-channel transistor and a drain of the first N-channel transistor;
a maximum supply voltage coupled to a source of the first P-channel transistor;
a minimum supply voltage coupled to a source of the first N-channel transistor;
the first bias voltage is controlled between the maximum supply voltage and an intermediate value of the maximum supply voltage that is greater than the minimum supply voltage;
the second bias voltage is controlled between the minimum supply voltage and an intermediate value of the minimum supply voltage that is less than the maximum supply voltage; and
an output node coupled between the pull-up section and the pull-down section, the output node is coupled to provide a specified voltage to a load.

14. The device of claim 13, further comprising:
a bias generator;

a first bias switch including an N-channel transistor having a drain connected to a first node at the first bias voltage, a source coupled to a first output of the bias generator, and a gate coupled to a first output of a gate control module;

a second bias switch including a P-channel transistor having a drain connected to a second node at the second bias voltage, a source coupled to a second output of the bias generator, and a gate coupled to a second output of the gate control module.

15. The device of claim 14, wherein the bias generator includes:

a voltage divider coupled between the maximum supply voltage and the minimum supply voltage, the voltage divider including a series of resistive elements;

a capacitor coupled in parallel with one of the resistive elements, the first output is tapped before the one of the resistive elements, and the second output is tapped after the one of the resistive elements.

16. The device of claim 14, further comprising:

a gate control module including an input, a first output and a second output;

the first output is coupled to a gate of the N-channel transistor of the first bias switch and a gate of the first P-channel transistor of the pull-up section;

the second output is coupled to a gate of the P-channel transistor of the second bias switch and a gate of the first N-channel transistor of the pull-down section.

17. The device of claim 16, wherein the gate control module includes:

a first level shifter configured to receive a signal at the input and to provide the first output; and a second level shifter configured to receive the signal at the input and to provide the second output.

18. The device of claim 16, wherein the input to the gate control module is coupled to the specified voltage to the load.

19. The device of claim 13, wherein:

a drain of the first P-channel transistor is coupled to a source of the cascode P-channel transistor of the pull-up section; and a source of the cascode N-channel transistor is coupled to a drain of the first N-channel transistor of the pull-down section.

20. The device of claim 14, wherein:

a gate of the cascode P-channel transistor is coupled to the first output of the bias generator; and a gate of the cascode N-channel transistor is coupled to the second output of the bias generator.

\* \* \* \* \*